United States Patent [19]
Brown et al.

[11] 4,263,058
[45] Apr. 21, 1981

[54] COMPOSITE CONDUCTIVE STRUCTURES IN INTEGRATED CIRCUITS AND METHOD OF MAKING SAME

[75] Inventors: Dale M. Brown; Marvin Garfinkel, both of Schenectady, N.Y.

[73] Assignee: General Electric Company, Schenectady, N.Y.

[21] Appl. No.: 115,069

[22] Filed: Jan. 24, 1980

Related U.S. Application Data

[62] Division of Ser. No. 47,889, Jun. 11, 1979, Pat. No. 4,228,212.

[51] Int. Cl.³ .......................................... H01L 21/283
[52] U.S. Cl. .......................................... 148/6; 427/88; 427/91; 427/93; 357/67; 357/71
[58] Field of Search ................... 428/209, 210; 148/6, 148/31.5; 427/88, 91, 93; 357/67, 71; 29/589, 590

[56] References Cited

U.S. PATENT DOCUMENTS

| | | |
|---|---|---|
| 3,375,418 | 3/1968 | Garnache .............................. 427/86 |
| 4,109,372 | 8/1978 | Geffken ................................ 29/590 |
| 4,128,670 | 12/1978 | Gaesslen .............................. 427/88 |

Primary Examiner—Ralph S. Kendall
Attorney, Agent, or Firm—Julius J. Zaskalicky; James C. Davis, Jr.; Marvin Snyder

[57] ABSTRACT

A composite conductive structure in integrated circuit devices is described. The composite conductive structure includes an insulating substrate on which is provided a conductor of a refractory metal substantially nonreactive with silicon dioxide. A layer of a silicide of the refractory metal covers the conductor and a layer of silicon dioxide covers the layer of the silicide. A method of making such structures is also described.

5 Claims, 6 Drawing Figures

COMPOSITE CONDUCTIVE STRUCTURES IN INTEGRATED CIRCUITS AND METHOD OF MAKING SAME

This is a division of application Ser. No. 047,889, filed June 11, 1979, U.S. Pat. No. 4,228,212.

The present invention relates in general to composite conductive structures in integrated circuit devices.

As the density of circuit elements in integrated circuits and the speed of operation thereof is increased, the resistance of the electrodes and the interconnection lines must be decreased. Polycrystalline silicon material suitably doped has heretofore been utilized as an electrode and an interconnection line material as it is compatible with the making of integrated circuit devices on silicon substrates. The resistivity of such a material, even when heavily doped, cannot normally be reduced below a certain minimum resistivity of about 0.001 ohm-cm. Thus, the usefulness of such a material for the electrodes and interconnection lines in high density integrated circuits is limited. Refractory metals such as molybdenum have been used for first level electrodes and interconnection lines in integrated circuits. While molybdenum has a considerably lower resistivity than doped polycrystalline silicon, its use in circuitry presents problems. Molybdenum is not protected or passivated by the oxides that would be formed thereon in the various oxidation steps utilized in the fabrication of integrated circuits, as the oxides of molybdenum are highly volatile at the temperatures utilized. Also, the molybdenum oxides are not good insulators even at temperatures lower than the temperatures at which the molybdenum oxides become volatile. These characteristics of molybdenum have limited the use of molybdenum to single level structures where the molybdenum conductors can be covered with a deposited layer of insulating material, such as silicon dioxide. Even in this case, the structures including conductors of molybdenum must be carefully processed to prevent oxidation of the molybdenum conductors. The use of molybdenum in integrated circuit devices having two levels of metallization have been avoided because of the difficulties associated with passivating with good dielectric the underlying of first level electrodes and interconnections constituted of molybdenum.

The present invention is directed to the provision of structures and methods of making same which overcome the problems and difficulties heretofore experienced in the utilization of molybdenum metallization in integrated circuits.

An object of the present invention is to provide an improved composite conductive structure for use in integrated circuits of high density and operating at high speeds.

Another object of the present invention is the provision of a composite structure including two levels of metallization for integrated circuits in which the first level is constituted of a refractory metal which is substantially non-reactive with silicon dioxide.

A further object of the present invention is to provide methods of making composite conductive structures including a conductive element selected from the class of refractory metals which are substantially non-reactive with silicon dioxide for use in integrated circuits.

In carrying out the present invention in an illustrative embodiment thereof there is provided a substrate of semiconductor material having a major surface on which is included a layer of insulating material. A conductor of metallic material selected from the class of refractory metals which are substantially non-reactive with silicon dioxide is provided overlying the insulating layer. A layer of a silicide of the metallic material is provided over the exposed surfaces of the conductor. A layer of silicon dioxide is formed over the exposed surfaces of the layer of the silicide of the metallic material.

In carrying out the method of the present invention in accordance with one embodiment thereof a substrate of semiconductor material having an overlying layer of insulating material is provided. A conductor of molybdenum is formed in a desired pattern overlying the layer of insulating material. A layer of a silicide of molybdenum is formed over the exposed surfaces of the conductor. The substrate including the conductor and the overlying layer of molybdenum silicide is heated in an oxidizing atmosphere at a temperature and for a time to cause the oxidant to react with the layer of molybdenum silicide to convert a portion thereof to silicon dioxide overlying another portion of the layer of molybdenum silicide unconverted to silicon dioxide. Alternatively, the layer of molybdenum silicide may be completely converted to silicon dioxide.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

Figure 1:
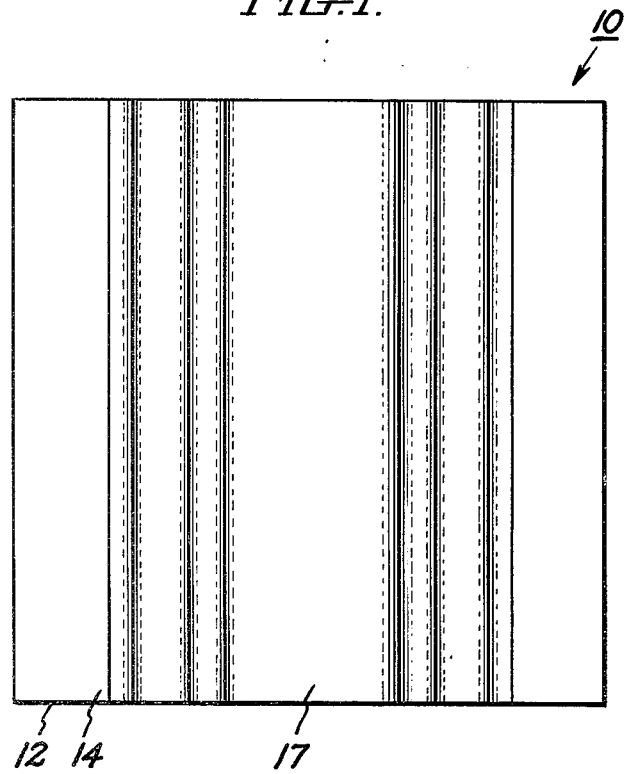
FIG. 1 is a plan view of a composite body which includes an insulating substrate on which a first level of metallization of molybdenum has been formed followed by a layer of molybdenum silicide and thereafter followed by a passivating layer of silicon dioxide in accordance with the present invention.

Referring now to FIG. 1 there is shown a composite body 10 illustrating a first level conductor 11 of molybdenum in accordance with the present invention. The composite body 10 includes a substrate 12 constituted of a substrate 13 of silicon on which a layer 14 of silicon dioxide has been formed. The layer 14 may represent either gate or field oxide of an integrated circuit, such as an imaging array, a memory array, or a signal or a data processing circuit. Overlying the insulating layer 14 is the conductor 11 of molybdenum. The conductor 11 may be formed by initially providing a layer of molybdenum on the surface of the insulating layer 12 to a suitable thickness, for example, several thousand Angstroms by sputtering, for example, and thereafter patterning the layer by photoresist masking and etching techniques well known in the art. Overlying the conductor 11 and completely covering the exposed portions thereof is provided a layer 16 of molybdenum silicide which, for example, may be 1000 Angstroms thick bonded to the molybdenum conductor 11. Overlying and bonded to the layer 16 of molybdenum silicide is provided a layer 17 of silicon dioxide.

Figure 2:
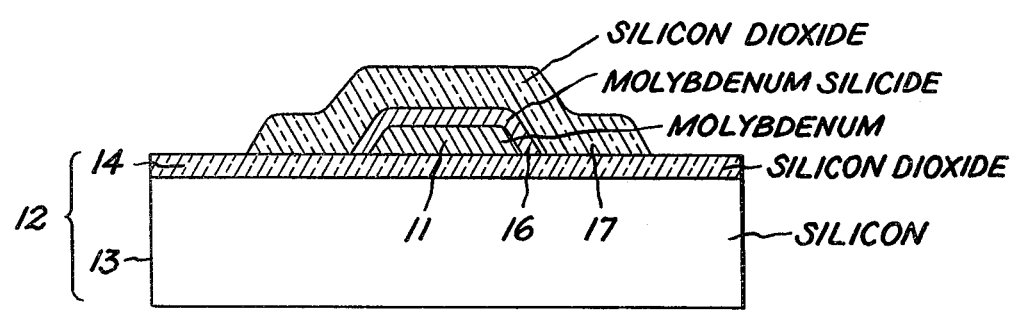
FIG. 2 is a cross-sectional view of the body of FIG. 1 taken along section lines 2—2 thereof.
Figure 3A:
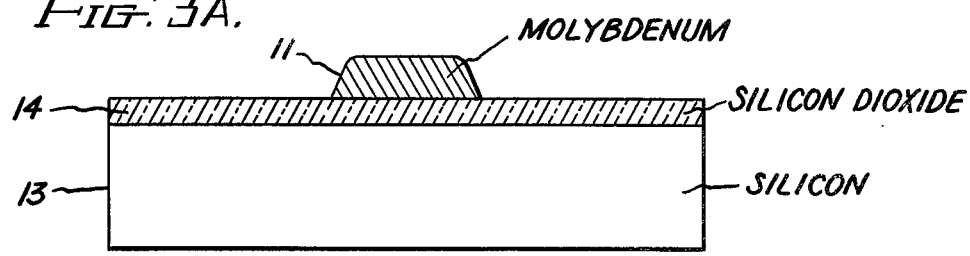
FIGS. 3A–3D show cross-sections of structures representing successive steps in one method of fabricating the composite structure in accordance with the present invention.
Figure 3B:
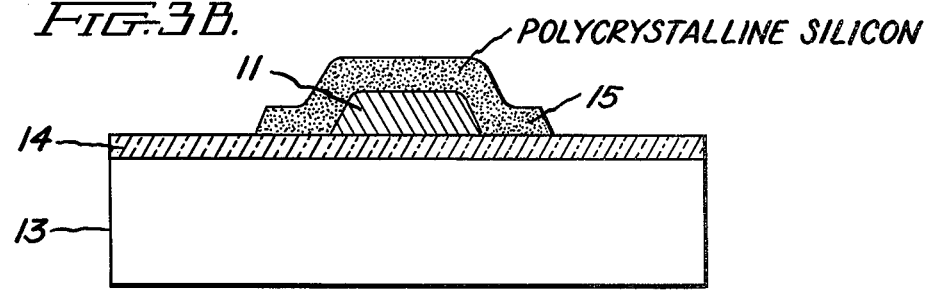
Figure 3C:
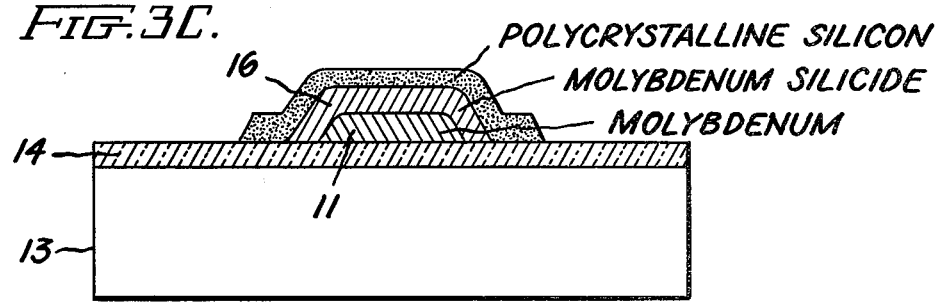
Figure 3D:
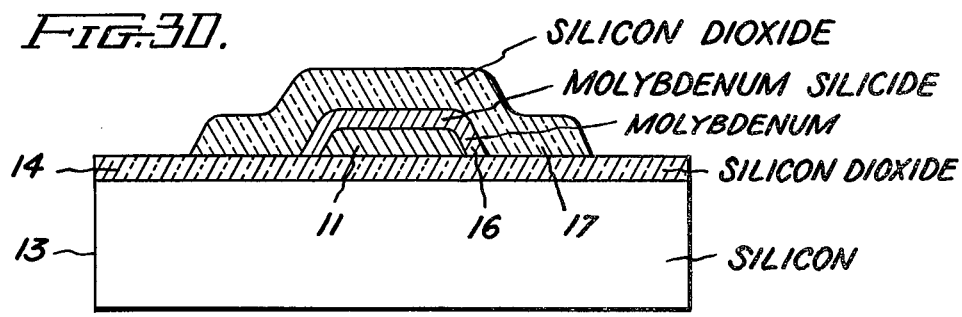

A method of fabricating the composite structure of FIGS. 1 and 2 will now be described in connection with FIGS. 3A–3D. Elements of FIGS. 3A–3D identical to elements of FIGS. 1 and 2 are identically designated. A substrate 13 of silicon semiconductor material about 10 mils thick with a layer 14 of thermally-grown silicon dioxide about 1000 Angstroms thick thereon is provided. A layer of molybdenum approximately 3000 Angstroms thick is deposited on the insulating layer by sputtering, for example. The layer of molybdenum is patterned using photoresist masking and etching techniques well-known in the art to provide a conductor 11, as shown in FIG. 3A. Thereafter, a layer of polycrystalline silicon 15 about 2000 Angstroms thick is deposited over the molybdenum conductor 11 and the layer 14 of silicon dioxide by pyrolytic decomposition of silane at about 750° C. in a stream of an inert carrier gas such as argon, for example. Next, the layer of polycrystalline silicon overlying the molybdenum conductor 11 is masked with a photoresist by techniques well-known in the art. The portions of the polycrystalline silicon layer not covered with the photoresist are etched with a suitable silicon etch, such as an aqueous solution of potassium hydroxide which selectively etches the polycrystalline silicon without significantly etching the silicon dioxide insulating layer 14 to produce the structure shown in FIG. 3B in which the conductor 11 is covered by an overlying layer 15 of polycrystalline silicon about 2000 Angstroms thick. This structure is heated in an inert atmosphere to a temperature of about 1000° C. for a time to react the polycrystalline silicon with the molybdenum conductor 11 to provide a suitably thick layer of molybdenum silicide overlying the unreacted portion of the molybdenum conductor 11 and bonded thereto, as shown in FIG. 3C. If reaction time is limited, an outer portion of the layer of polycrystalline silicon may remain unreacted as shown in FIG. 3C. The composite body of FIG. 3C is then oxidized in an oxidizing atmosphere such as oxygen at a temperature of about 1000° C. to cause the outer portion of the polycrystalline layer 15 to be oxidized into silicon dioxide and also to cause a portion of the layer 16 of molybdenum silicide to be oxidized into silicon dioxide leaving a portion of the layer of molybdenum silicide covering the molybdenum conductor 11. This portion of the layer of molybdenum silicide provides a shield between the molybdenum conductor 11 and the oxidizing atmosphere and conveniently is selected to be several thousand Angstroms thick, although it can be substantially thinner. The initial thickness of the molybdenum silicide layer of the composite body of FIG. 3C is selected to be sufficiently thick to enable a silicon dioxide layer of the desired thickness to be provided as shown in FIG. 3D. For example, when a second level of metallization is to be provided over the silicon dioxide layer, the silicon dioxide layer would be made sufficiently thick to provide good electrical insulation between the two levels. The thickness of this layer of silicon dioxide and the thickness of the remaining portion of the layer of molybdenum silicide is dependent on the time and temperature parameters of the oxidation process. Thus, a composite structure including a molybdenum conductor completely encapsulated by silicon dioxide is provided, as shown in FIG. 3D. As the exposed surface of the composite structure is constituted of silicon dioxide, a second level of metallization including molybdenum may be provided in the same manner as provided in the first level of metallization.

While the invention has been described and illustrated in connection with composite electrode structures in which the conductor 11 is constituted of molybdenum, it is apparent that in view of the similarity in the compounds of tungsten to the compounds of molybdenum, particularly the oxides and silicides, the conductor 11 may be constituted of tungsten. Also, the conductor 11 may be constituted of other refractory metals which are substantially non-reactive with silicon dioxide such as tantalum, platinum and palladium. In addition, the alloys of the refractory metals mentioned above in which refractory metal constitutes a major portion thereof are suitable for the conductor 11.

While the layer of insulating material 14 on which the conductive member 11 of molybdenum was formed is silicon dioxide it is apparent that the insulating layer may be constituted of any of a number of materials such as, for example, silicon nitride, or a layer of silicon nitride, overlying a layer of silicon dioxide, or combinations thereof. Also, while a silicon substrate has been shown as the material on which the insulating layer of silicon dioxide is formed, any of a number of semiconductor substrates may be utilized, for example, gallium arsenide.

While the invention has been described in specific embodiments, it will be appreciated that modifications, such as those described above may be made by those skilled in the art and it is intended by the appended claims to cover all such modifications and changes as fall in the true spirit and scope of the invention.

What we claim as new and desire to secure by Letters Patent of the United States is:

1. The method of forming a composite structure comprising:
    providing a substrate of semiconductor material having an overlying layer of insulating material,
    forming a conductor of a refractory metallic material which is substantially non-reactive with silicon dioxide in a desired pattern overlying said layer of insulating material,
    forming over said layer of insulating material including said conductor of metallic material a layer of polycrystalline silicon,
    patterning said layer of polycrystalline silicon to provide a patterned portion of said layer of polycrystalline silicon overlying said conductor and removing the remainder thereof,
    heating said substrate including said conductor of metallic material and said patterned portion of said layer of polycrystalline silicon to a temperature and for a time to cause said patterned portion of said layer of polycrystalline silicon to react with a portion of said conductor to form a layer of a silicide of said refractory metallic material overlying another portion of said conductor unconverted to said silicide thereof,
    heating said substrate including said conductor and said layer of said silicide in an oxidizing atmosphere at a temperature and for a time to cause said oxidizing atmosphere to react with said layer of said silicide to convert a portion thereof to silicon dioxide overlying another portion of said layer of said silicide unconverted to silicon dioxide.

2. The method of claim 1 in which said substrate including said patterned portion of polycrystalline silicon is heated to a temperature and for a time to leave a portion of said layer of polycrystalline silicon unreacted with said conductor.

3. The method of claim 1 in which said patterned layer of polycrystalline silicon is provided by chemical vapor deposition of silicon and subsequent patterning thereof.

4. The method of claim 1 in which the temperature to which said substrate is heated to cause said patterned layer of polycrystalline silicon to react with said conductor is above 1000° C.

5. The method of claim 1 in which said semiconductor material is silicon.

* * * * *